United States Patent [19]

Jenkinson

[11] Patent Number: 6,078,180
[45] Date of Patent: Jun. 20, 2000

[54] MONITORING PARTIAL DISCHARGES

[75] Inventor: Christopher Graham Jenkinson, Transvaal, South Africa

[73] Assignee: Patented Devices (Proprietary) Limited, Transvaal, South Africa

[21] Appl. No.: 08/151,041

[22] Filed: Nov. 12, 1993

Related U.S. Application Data

[63] Continuation of application No. 07/808,713, Dec. 17, 1991, abandoned.

[30] Foreign Application Priority Data

Dec. 17, 1990 [ZA] South Africa .......................... 90/10126

[51] Int. Cl.[7] ..................................................... G01R 31/08
[52] U.S. Cl. ............................ 324/536; 324/557; 324/551
[58] Field of Search ........................... 324/557, 158 MG, 324/536, 552, 551, 541, 544, 533

[56] References Cited

U.S. PATENT DOCUMENTS

| 2,651,752 | 9/1953  | Devot ...................................... 324/533 |
| 2,707,267 | 4/1955  | Gavin ...................................... 324/533 |
| 3,421,076 | 1/1969  | Eigen ...................................... 324/536 |
| 3,727,128 | 4/1973  | McFerrin ................................ 324/533 |
| 3,801,899 | 4/1974  | Liao ........................................ 324/536 |
| 3,909,712 | 9/1975  | Rietz ...................................... 324/533 |
| 4,291,204 | 9/1981  | Crick ...................................... 324/536 |
| 4,549,132 | 10/1985 | Yamagiwa .............................. 324/536 |
| 4,775,839 | 10/1988 | Kosina .................................... 324/536 |
| 4,829,256 | 5/1989  | Yamagiwa .............................. 324/536 |
| 5,200,737 | 4/1993  | Konishi .................................. 324/514 |

*Primary Examiner*—Diep N. Do
*Assistant Examiner*—Jose M. Solis
*Attorney, Agent, or Firm*—McDermott, Will & Emery

[57] ABSTRACT

A method of initiating and monitoring partial discharges in an insulating medium is disclosed. Apparatus for performing the method is also disclosed. A relatively low frequency time varying exciting waveform is applied to a sample of an insulating medium. A trigger pulse of short duration is superimposed on the exciting waveform to initiate partial discharge activity in the sample. The apparatus includes a trigger pulse generator with a synchronizing circuit which provides a pre trigger signal for an oscilloscope, allowing the resultant partial discharge activity to be monitored.

21 Claims, 4 Drawing Sheets

MONITORING PARTIAL DISCHARGES

This application is a continuation of application Ser. No. 07/808,713 filed Dec. 17, 1991, now abandoned.

BACKGROUND OF THE INVENTION

This invention relates to a method of and apparatus for monitoring partial discharge activity in an insulating medium.

Partial discharges occur in insulating media such as the insulation of electrical cables, where an entrapped void of another material (usually a gas) is present in the medium. The presence of the void causes a disturbance in the electric field distribution in the insulating material, with the effect that electrical breakdown of the void can occur independently of the breakdown of the insulating material as a whole. The resulting local flashover or discharge is referred to as a partial discharge. This effect is largely capacitive in nature, and partial discharges typically occur in alternating current electrical distribution systems where the applied voltages are sufficiently high to cause a problem.

Prolonged and/or excessive partial discharge activity in an insulating medium will tend to cause eventual degradation and failure of the insulation. Thus, it is desirable to monitor partial discharge activity to provide an early warning of possible insulation failure. Conventional equipment for measuring partial discharges is illustrated in FIG. 1 of the drawings. The equipment is connected to an AC mains source and comprises a variac 1 which controls the input voltage to a step-up power transformer 2. The secondary winding of the step-up transformer 2 is connected in series with a sample 3 to be measured, a partial discharge-free inductance 4 and a measuring impedance 5. A standard capacitor 6 is connected in parallel with the sample 3 and the measuring impedance 5. The capacitor 6 provides a return path for current at pulse frequencies, while the inductance blocks high frequencies.

The measuring impedance 5 is typically a medium frequency RLC resonant circuit which has the effect of extending the duration of the partial discharge waveform, making it more easily measurable. An oscilloscope 7 is fed with a signal corresponding to the low frequency exciting waveform as well as a phase-shifted version thereof, to produce a Lissajou figure on its screen, with the voltage measured across the measuring impedance 5 superimposed on it. This allows a rough impression to be gained of the timing of the partial discharge relative to the exciting waveform. The height (voltage) of the partial discharge pulses corresponds to the charge transferred, allowing the intensity of the pulses to be calculated.

In practice, accurate measurement of such partial discharges is difficult, due to the very small magnitude of the partial discharges (typically several pico coulombs). This creates problems in terms of the sensitivity and signal to noise capabilities of measuring equipment. Furthermore, the timing of the partial discharges tends to be somewhat random. By this is meant that the timing variation (timing jitter) of successive partial discharges of respective voids is likely to be several orders of magnitude greater than the length of each partial discharge event. This makes digital auto-correlation techniques, in particular, very difficult. A further problem arises from the extremely high frequencies of the partial discharge pulses. Since it is usually desirable to digitise the partial discharge waveforms for analysis, the combination of timing jitter and the presence of very high frequency components in the partial discharge pulses requires the use of extremely high speed digitisation equipment with attendant problems of expense and excessive memory requirements. The greater the timing jitter of the partial discharge pulses, the larger must be the capture "window" of the digitisation apparatus, which requires a proportional increase in memory.

SUMMARY OF THE INVENTION

According to the invention a method of initiating a partial discharge in an insulating medium comprises applying a time varying exciting waveform to a sample of the medium, the waveform having a predetermined component with a sufficiently great amplitude and a sufficiently fast rise time to initiate a partial discharge in the medium substantially simultaneously with the occurrence of the predetermined component of the waveform.

The method may comprise superimposing a trigger pulse on a relatively low frequency exciting waveform to initiate a partial discharge in the sample substantially simultaneously with the occurrence of the trigger pulse.

Preferably the trigger pulse has a short duration relative to the period of the exciting waveform.

Typically, the frequency of the exciting waveform is in the range 0.1 to 100 Hz, while the duration of the trigger pulse is preferably less than 5 $\mu$s.

The trigger pulse may be a step or impulse waveform, with a rise time less than 500 ns.

Preferably, the amplitude of the exciting waveform is sufficiently great to precipitate partial discharge activity in the sample independently of the trigger pulse, the trigger pulse being initiated when the magnitude of the exciting waveform approaches the nominal breakdown voltage of a partial discharge site.

The invention extends to a method of monitoring partial discharge activity comprising initiating a partial discharge according to the method defined above, and monitoring at least one parameter of the partial discharge.

The method of monitoring the partial discharge activity may comprise generating a trigger signal which is synchronised with the trigger pulse and which occurs prior to the trigger pulse, applying the trigger signal to a trigger input of an oscilloscope, and monitoring the partial discharge waveform on the oscilloscope.

Further according to the invention apparatus for initiating a partial discharge in an insulating medium comprises waveform generator means for applying a time varying exciting waveform to a sample of the medium, the generator means being adapted to generate an exciting waveform having a predetermined component with a sufficiently great amplitude and a sufficiently fast rise time to initiate a partial discharge in the medium substantially simultaneously with the occurrence of the predetermined component of the waveform.

The waveform generator means may comprise a transformer connected to an AC mains source, or a variable frequency signal generator.

The apparatus may include second waveform generator means for generating a trigger pulse for initiating a partial discharge in the sample, and coupling means for superimposing the trigger pulse on the exciting waveform.

The second waveform generator means is preferably adapted to generate a trigger pulse having a duration of less than 5 $\mu$s.

The trigger pulse may be a step or impulse waveform, and preferably has a rise time less than 500 ns.

The amplitude of the trigger pulse is preferably between 5% and 25% of the amplitude of the exciting waveform.

The second waveform generator means may be adjustable to generate the trigger pulse a predetermined time after a zero crossing of the exciting waveform.

The exciting waveform may be sinusoidal, the trigger pulse being generated at a time corresponding to a phase angle of the exciting waveform between 40° and 90°.

The apparatus may include synchronising means for generating a trigger signal synchronised with the trigger pulse and which occurs prior to the trigger pulse, for application to a trigger input of an oscilloscope arranged to monitor the partial discharge.

The apparatus may also include adjustable delay means for adjusting the timing between the trigger pulse and the trigger signal.

The apparatus may be adjustable to vary the amplitude of the trigger pulse.

Preferably, the circuit is also adjustable to vary the rise time of the trigger pulse.

DESCRIPTION OF AN EMBODIMENT

Figure 2:
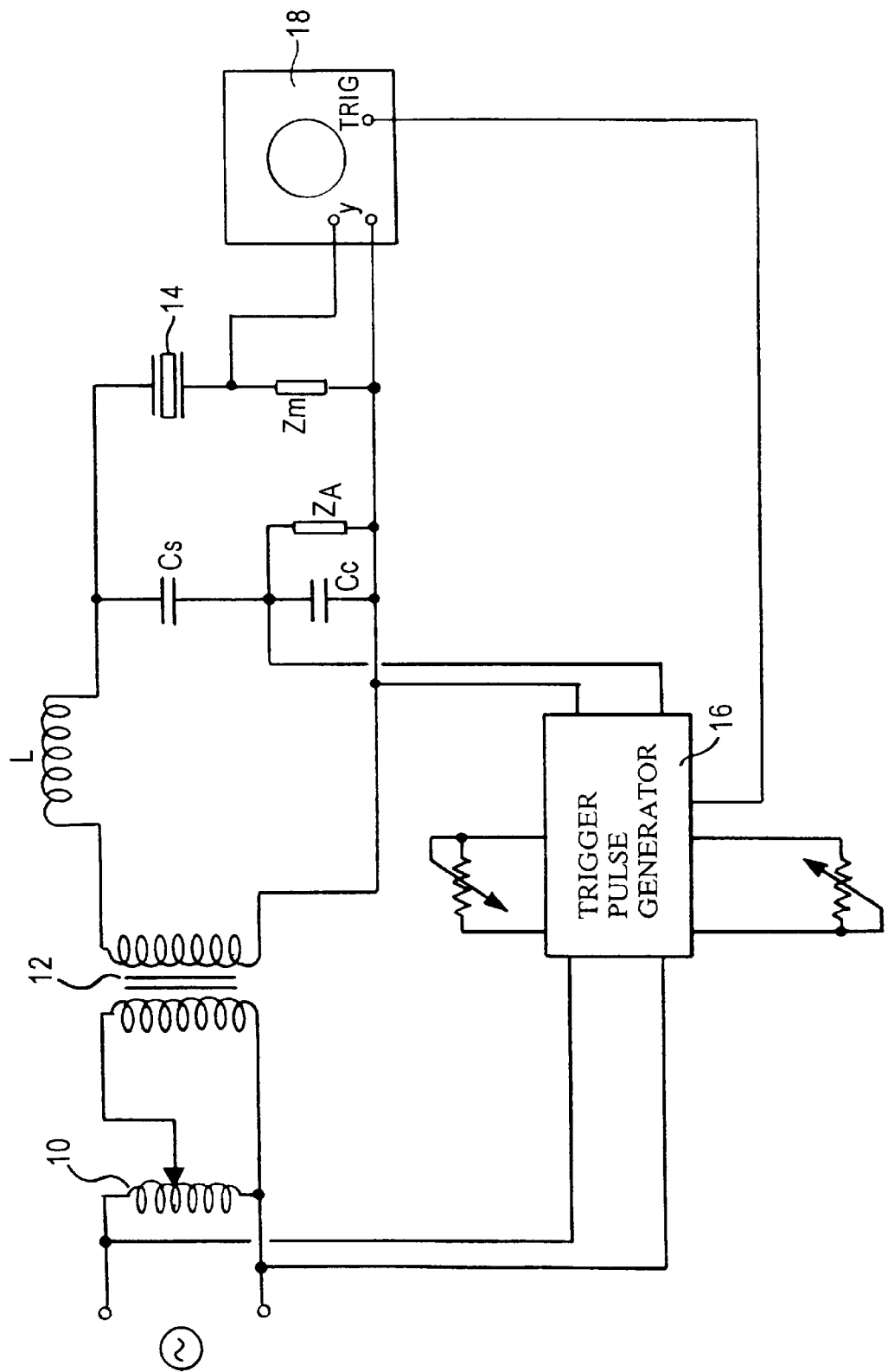
FIG. 2 is a simplified block schematic diagram of apparatus according to the invention.

FIG. 2 is a simplified block diagram illustrating the apparatus of the invention. A variac 10 connected to an AC mains source provides a variable input voltage to the primary winding of a step-up transformer 12. The secondary winding of the transformer 12 is connected in series with a sample 14 to be tested, a measuring impedance $Z_m$ and a partial discharge-free inductor L. Connected in parallel with the sample 14 and the measuring impedance $Z_m$ are a standard capacitor C., an auxiliary impedance $Z_A$ and a coupling capacitor $C_c$. An adjustable trigger pulse generating circuit 16 is connected across the coupling impedance and the coupling capacitor and is arranged to inject trigger pulses into the measuring circuit. The inductor L prevents high frequency trigger pulses from being fed back to the AC mains.

While FIG. 2 shows a specific embodiment, it should be noted that other circuit arrangements are possible. The following aspects should be provided by such a circuit:

- a high-frequency by-pass path in parallel with the series circuit of measuring impedance and sample;
- an injection path for the trigger pulse, coupling at a relatively high frequency;
- filtering of the various frequencies of excitation into different paths; and
- a protective impedance or component to limit applied voltage reverse-injected into the trigger pulse generation circuit.

The trigger pulse generating circuit 16 has an input which is connected to the AC mains and monitors the AC mains waveform, and is adjustable to generate trigger pulses of variable height at a predetermined time after zero crossings of the mains waveform. These pulses are superimposed on a low frequency high voltage exciting waveform applied to the sample 14 by the measuring circuit. An oscilloscope 18 is connected to measure the voltage waveform across the measuring impedance $Z_m$ due to partial discharge activity, and is triggered by a synchronisation signal from the trigger pulse generator circuit 16.

Figure 3:
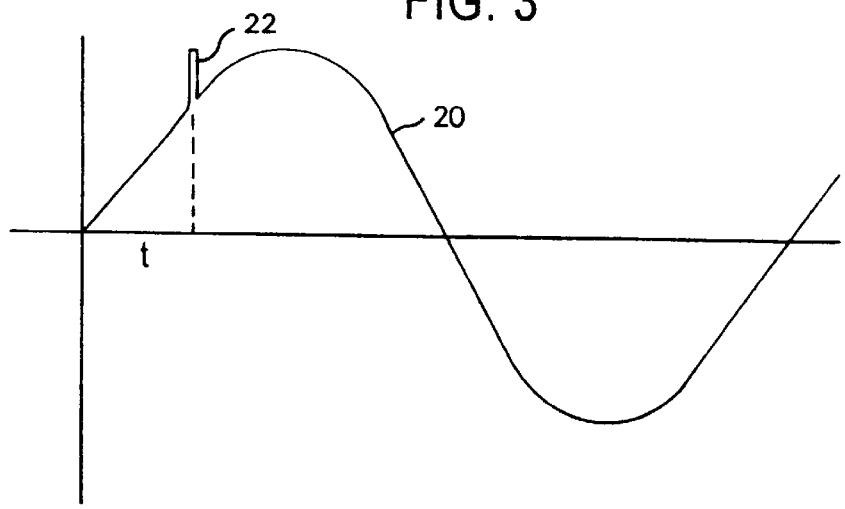
FIG. 3 is a schematic illustration of a typical test waveform of the apparatus of FIG. 2.

The effect of the circuit 16 is to superimpose a step or impulse waveform from the trigger pulse generating unit 16 onto the relatively low frequency sinusoidal (or otherwise time varying) exciting waveform applied to the sample 14. In the case of an exciting waveform derived from the AC mains supply, the exciting waveform will have a frequency of 50 or 60 Hz, with an amplitude of several kilovolts (typically up to about 4000 volts on small samples) depending on the characteristics of the step-up transformer 12 and the setting of the variac 10. Of course, instead of obtaining the low frequency exciting waveform from the AC mains supply, a variable frequency signal generator can be used instead. Such a signal generator can be used to provide an exciting waveform of still lower frequency, typically in the range 0.1 Hz to 100 Hz. The low frequency exciting waveform with a trigger pulse superimposed thereon is shown schematically in FIG. 3, which is not drawn to scale. The exciting waveform is indicated by the reference numeral 20, with the superimposed trigger pulse indicated by the reference numeral 22.

The pulse duration is preferably of the order of several hundred nanoseconds. The amplitude of the pulse 22 may vary widely, depending on the application In some applications, the pulse 22 may have an amplitude of 40% or more of the amplitude of the exciting waveform. The amplitude of the pulse 22 relative to that of the waveform 20 will often be fairly small, however, and may typically be in the region of 2 to 25%, and typically 5 to 10% of the amplitude of the waveform 20. The pulse 22 is generated a predetermined time t after the zero crossing of the exciting waveform 20, typically at a phase angle of the exciting waveform of between about 40° and 90° after a zero crossing. The timing of the pulse 22 will of course depend on the amplitude of the exciting waveform, which can be adjusted so that partial discharges are precipitated towards the peak of the exciting waveform. This prevents multiple discharges which might otherwise hinder measurements. The trigger pulse effectively applies a temporary relatively high overvoltage to the voids in the sample 14 which are subject to partial discharges, thus accelerating the electrical breakdown of the voids. The void voltage/time breakdown characteristic follows a high inverse power law, so that the rapid overvoltage introduced by the trigger pulse precipitates breakdown of the voids very quickly. This dramatically reduces the time jitter of the partial discharges, to the extent that the partial discharges occur practically simultaneously with the application of the trigger pulse.

Figure 1:
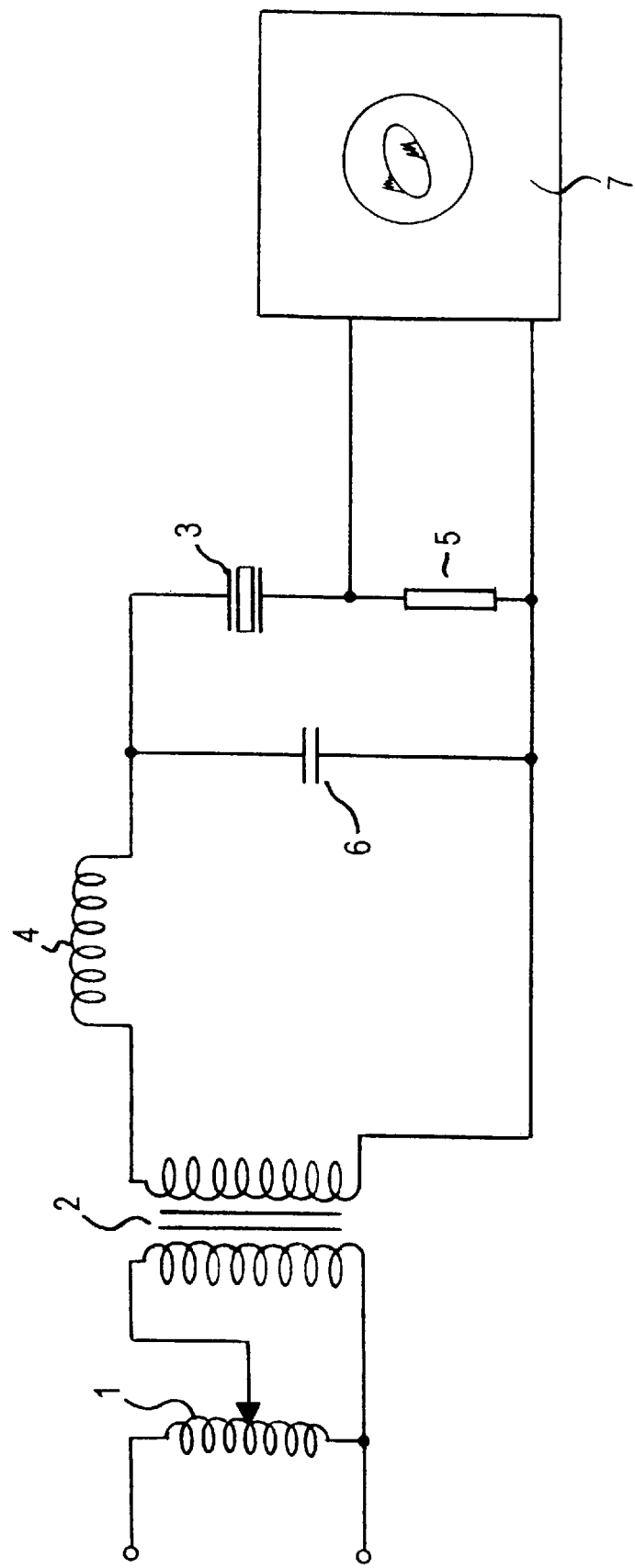
FIG. 1 is a block schematic diagram of prior art apparatus for monitoring partial discharge activity.

In the prior art measuring circuit of FIG. 1, the partial discharges will occur at an unpredictable time as the exciting waveform varies in amplitude, due to the breakdown mechanism of partial discharges being statistical in nature.

This timing jitter may typically be of the order of several hundred microseconds, while the partial discharge event may occur in a few nanoseconds. However, the circuit of the invention reduces this jitter significantly.

Figure 4:
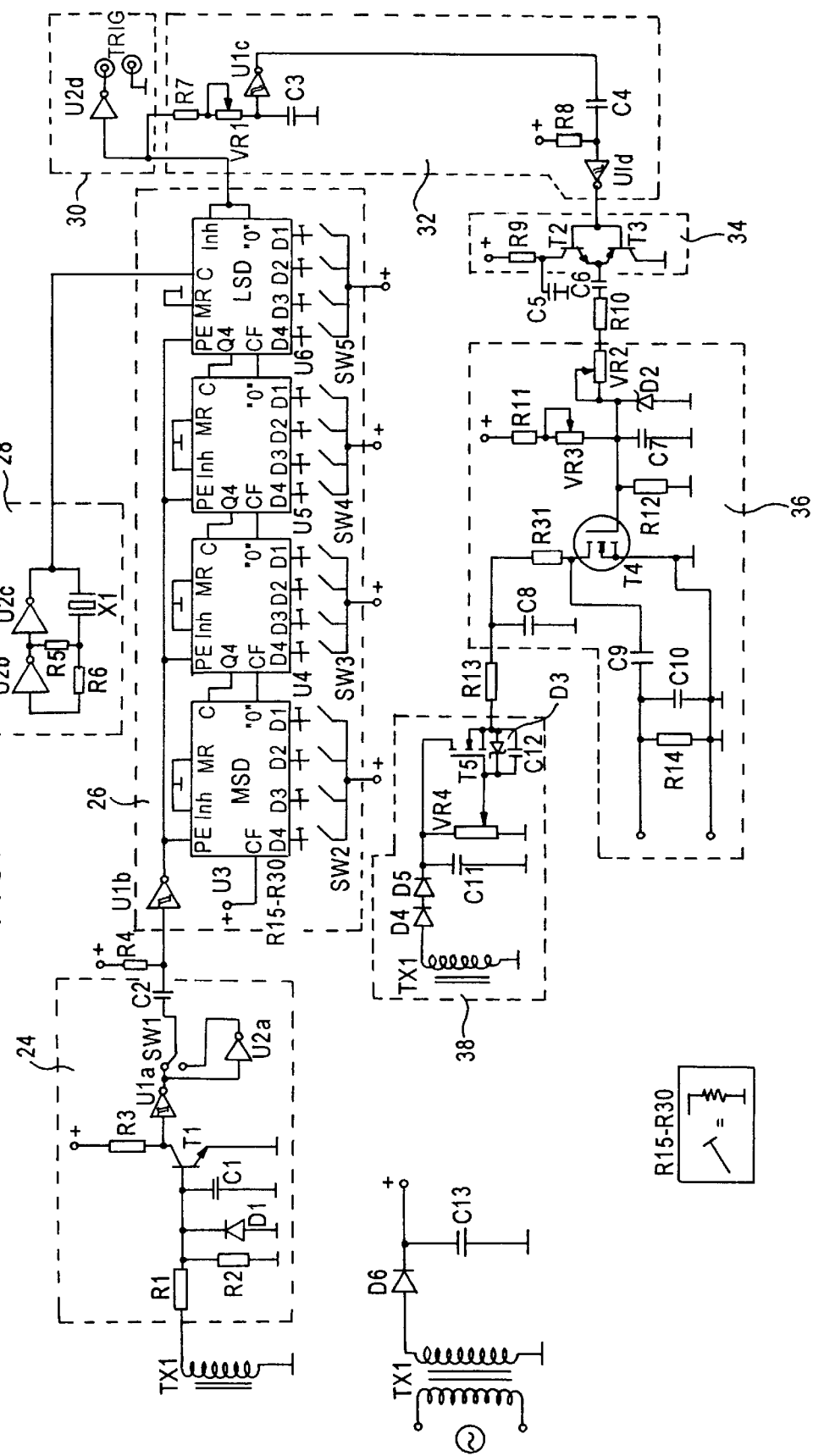
FIG. 4 is a detailed schematic diagram of a trigger pulse circuit of the apparatus of FIG. 2.

The trigger pulse generating circuit 16 of FIG. 2 will now be discussed in greater detail, with reference to FIG. 4 of the drawings. The embodiment of the invention illustrated in FIG. 4 is configured for use with a measuring circuit which uses an exciting waveform derived from a 50 Hz AC mains supply. It will be understood that the circuit can readily be adapted for use with a variable frequency signal generator.

A 50 Hz reference waveform is obtained from the secondary of a transformer TX1 which powers the circuit 16, and applies it to a circuit 24 which generates a reference pulse which is used to synchronise the 50 Hz exciting waveform with the high frequency trigger pulse. The 50 Hz waveform is fed to a squaring transistor T1 which acts as a zero crossing comparator. The output of the transistor T1 is inverted by a Schmitt trigger U1a, the output of which is fed to a switch SW1. The switch selects the output of the Schmitt trigger directly, or an inverted output via an inverter U2a, allowing an edge of desired polarity to be derived from either of the two zero crossing points per cycle of the mains waveform. The selected edge is converted to a short duration pulse by a monostable comprising a capacitor C2 and a Schmitt trigger U1b.

The output of the reference pulse circuit 24 is fed to a timing circuit 26 which comprises a set of cascaded presettable down-counters U3, U4, U5 and U6.

The counters are typically type 4522 CMOS devices. The output pulse from the monostable is fed to the preset input of the set of down-counters. A pulse on the preset input forces all the counters to be preset to the count value selected on associated BCD-encoded thumb wheel switches SW2, SW3, SW4 and SW5. The count value corresponds to the number of microseconds delay which is desired, after the appropriate zero-crossing in the AC waveform, until the trigger pulse generating circuitry is fired. The counters are connected so that an output is obtained only once a number of clock cycles equal to the preset value have elapsed since the occurrence of the preset pulse. Since the counters are fed by a 1 MHz clock and are configured as a BCD counter, the value shown on the thumb wheel switches represents the decimal value of the number of microseconds of delay. The 1 MHz clock signal is obtained from a crystal-based square wave oscillator circuit 28.

On the termination of the down-count of the timing circuit 26, an output pulse is generated, which is fed to a buffer circuit 30, which applies a synchronisation signal to the trigger input of the oscilloscope 18. The output of the timing circuit is also fed to a delay circuit 32 which comprises an adjustable monostable built around a Schmitt trigger U1c. This circuit has the effect of providing a "pre-trigger" facility for the oscilloscope, by delaying the generation of the trigger pulse for some few hundred nanoseconds to a few microseconds after the synchronising signal is applied to the trigger input of the oscilloscope via the circuit 30.

The delayed output from the delay circuit 32 is applied to a buffer stage 34. A monostable based around a Schmitt trigger U1d in the delay circuit 32 ensures that the drive pulse generated by the buffer 34 lasts for only approximately 10 to 20 microseconds.

The drive pulse is applied to a trigger pulse generator circuit 36 which is based around a high voltage power FET T4 which is used as a high speed switch. The FET T4 switches the output of a high voltage power supply circuit 38 which generates an HT rail of approximately 450 volts, which is then regulated by a power FET T5 and associated components to provide an output voltage which can be varied between zero and 450 volts.

In the trigger pulse generator circuit 36, the gate of the FET T4 is pre-biased to just below conduction, and the drive pulse from the buffer 34 is coupled to the gate via an adjustable impedance in the form of a potentiometer VR2. When the drive pulse is applied to the FET T4, it switches on at a speed dependent on the setting of the potentiometer VR2, allowing adjustment of the slope of the rising edge of the output trigger pulse. When the FET T4 is biased off, a tank capacitor C8 of relatively large value connected to the output of the high voltage power supply 38 will charge up a capacitor C9 via a resistor R31 to the output voltage of the power supply. When the drive pulse from the buffer 34 is received by the FET T4, it effectively discharges the capacitor C9 into the measurement circuit. When the drive pulse is delivered by the buffer 34, the drain voltage of the FET T4 falls rapidly, thus injecting a pulse of the preselected voltage via the coupling capacitor $C_c$ to the sample 14. The magnitude of the output pulse is dependent on the voltage division ratio determined by the capacitors C9 and C10 in the output circuit of the trigger pulse generator circuit, together with any further division from the remainder of the measurement circuit components. The output pulse voltage is maintained until the drive pulse switches off, allowing the trigger pulse generator circuit to reset to its initial state.

Figure 5:
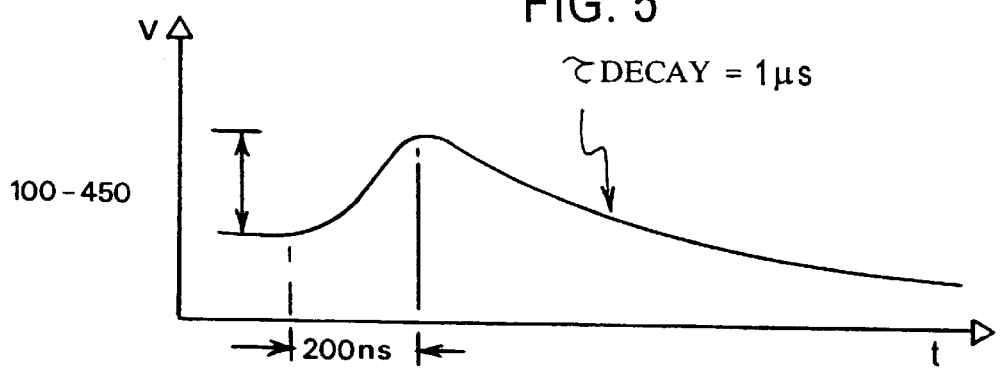
FIGS. 5 and 6 are waveform diagrams illustrating the operation of the apparatus of FIGS. 2 and 4.
Figure 6:
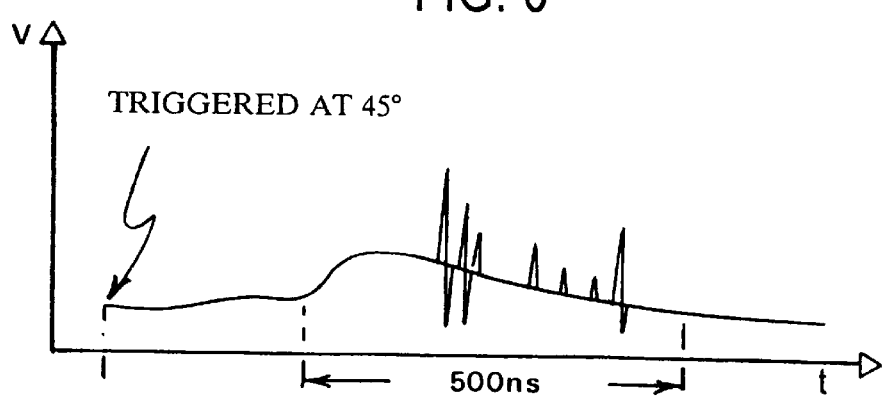

FIG. 5 illustrates a typical trigger pulse generated by the circuit of FIG. 4. The pulse has an amplitude of between 100 and 450 volts, with a rise time of approximately 200 ns. The decay period $\tau$ of the pulse is approximately 1 $\mu$s. This period is dependent on the value of the inductor L in FIG. 2 and other circuit capacitors and resistors. FIG. 6 illustrates a typical CRT trace on the oscilloscope 16. The pulse of FIG. 5 is superimposed on the low frequency exciting waveform at 45° after the zero crossing, with a pre-trigger delay of approximately 200 ns. The CRT trace shows a bump due to residual coupling of the trigger pulse, and shows high frequency pulses due to partial discharge activity over several cycles of the exciting waveform, spread over a period of less than 500 ns. Due to the relatively small "window" within which the partial discharge activity occurs, it is much easier to capture, digitise and store the partial discharge waveforms. Without the trigger pulse, the application of a low frequency exciting waveform of sufficient amplitude to cause partial discharges at approximately 45° after a zero crossing would typically result in a series of partial discharges spread over 1.5 ms, with a significant degree of jitter, which may be as high as 40°.

So far, the invention has been described in connection with the monitoring of partial discharge activity. For various reasons, it may be required that partial discharges be initiated reliably, even though direct monitoring of the partial discharge activity is not required. For example, it may be desired to precipitate partial discharge activity in a test cable for a predetermined period of time, in order to test the resistance of the cable insulation to deterioration under certain circumstances. In such applications, the invention insures the reliable triggering of the partial discharges.

Although the described invention is relatively simple in application, it provides a valuable solution to the problems of measuring partial discharges in an effective and economical way.

I claim:

1. Apparatus for monitoring a discharge in an insulating medium comprising:

waveform generator means for generating a periodic time varying exciting waveform for an insulating medium and for generating a short duration trigger pulse with a predetermined duration shorter than a period of the exciting waveform and a predetermined timing relative to the exciting waveform for initiating a discharge responsive to said trigger pulse in said insulating medium; and coupling means for applying the exciting waveform and the trigger pulse to a sample of said insulating medium for initiating discharge activity in the medium in response to the trigger pulse and substantially simultaneously with the occurrence of the trigger pulse at said predetermined timing relative to the exciting waveform.

2. Apparatus in accordance with claim 1, wherein said waveform generator means comprises:

trigger duration means for providing to said short duration trigger pulse a predetermined duration of a predetermined order of magnitude, said predetermined order of magnitude being at least an order of magnitude less than said period of the exciting waveform, and trigger magnitude means for providing to said short duration trigger pulse an amplitude sufficient for initiating said discharge activity within a time delay from occurrence of said trigger pulse having said predetermined order of magnitude of said predetermined duration of said trigger pulse.

3. Apparatus in accordance with claim 2, wherein said coupling means operating for applying the trigger pulse to said sample of said insulating medium for initiating said discharge activity responsive thereto within said time delay having said predetermined order of magnitude of said trigger pulse.

4. Apparatus in accordance with claim 1, wherein said waveform generator means comprises timing means for generating said trigger pulse within a range of 40° to 90° following a zero crossing of said periodic time varying exciting waveform.

5. Apparatus in accordance with claim 1, wherein said waveform generator means comprises timing means for generating said trigger pulse at substantially 45° following a zero crossing of said periodic time varying exciting waveform.

6. Apparatus for monitoring a partial discharge in an insulating medium comprising:

waveform generator means for generating a time varying exciting waveform to an insulating medium and for generating a trigger pulse for initiating a partial discharge in said insulating medium; and coupling means for applying the exciting waveform and the trigger pulse to a sample of said insulating medium so that partial discharge activity is initiated in the medium substantially simultaneously with the occurrence of the trigger pulse.

7. Apparatus according to claim 6 wherein the waveform generator means comprises a first waveform generator for generating a relatively low frequency exciting waveform, and a second waveform generator for generating the trigger pulse.

8. Apparatus according to claim 7 wherein the first waveform generator comprises a transformer connected to an AC main source.

9. Apparatus according to claim 7 wherein the first waveform generator comprises a variable frequency signal generator.

10. Apparatus according to claim 9, wherein the signal generator is adapted to generate an exciting waveform having a frequency in the range 0.1 to 100 Hz.

11. Apparatus according to claim 7 wherein the second waveform generator means is adapted to generate a trigger pulse having a duration of less than 5 µs.

12. Apparatus according to claim 7 wherein the trigger pulse is a step or impulse waveform.

13. Apparatus according to claim 12 wherein the rise time of the trigger pulse is less than 500 ns.

14. Apparatus according to claim 6 wherein the amplitude of the trigger pulse is between 2% and 40% of the amplitude of the exciting waveform.

15. Apparatus according to claim 14 wherein the amplitude of the trigger pulse is between 5% and 25% of the amplitude of the exciting waveform.

16. Apparatus according to claim 7 wherein the second waveform generator is adjustable to generate the trigger pulse a predetermined time after a zero crossing of the exciting waveform.

17. Apparatus according to claim 16 wherein the exciting waveform is sinusoidal and the trigger pulse is generated at a time corresponding to a phase angle of the exciting waveform between 40° and 90°.

18. Apparatus according to claim 6 including synchronizing means for generating a trigger signal synchronized with the trigger pulse and which occurs prior to the trigger pulse, for application to a trigger input of an oscilloscope arranged to monitor the partial discharge.

19. Apparatus according to claim 18 including adjustable delay means for adjusting the timing between the trigger pulse and the trigger signal.

20. Apparatus according to claim 7 wherein the second waveform generator is adjustable to vary the amplitude of the trigger pulse.

21. Apparatus according to claim 7 wherein the second waveform generator is adjustable to vary the rise time of the trigger pulse.

* * * * *